United States Patent
Lan (10) Patent No.: US 11,329,226 B2
(45) Date of Patent: May 10, 2022

(54) MEMORY DEVICES INCLUDING STEP SHAPE ELECTRODE AND METHODS FOR FORMING THE SAME

(71) Applicant: Winbond Electronics Corp., Taichung (TW)

(72) Inventor: Shun-Li Lan, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 16/695,774

(22) Filed: Nov. 26, 2019

(65) Prior Publication Data
US 2020/0403156 A1 Dec. 24, 2020

(30) Foreign Application Priority Data
Jun. 21, 2019 (TW) .................................. 108121652

(51) Int. Cl.
*H01L 45/00* (2006.01)

(52) U.S. Cl.
CPC ...... *H01L 45/1675* (2013.01); *H01L 45/1253* (2013.01); *H01L 45/147* (2013.01)

(58) Field of Classification Search
CPC .............. H01L 45/1675; H01L 45/1683; H01L 45/1608; H01L 45/085; H01L 45/1286; H01L 45/146; H01L 45/128; H01L 45/08; H01L 45/145; H01L 45/1233; H01L 45/1266
USPC ........................................................... 257/4
See application file for complete search history.

(56) References Cited

U.S. PATENT DOCUMENTS

| | | | |
|---|---|---|---|
| 7,205,238 B2 | 4/2007 | Pan et al. | |
| 9,583,498 B2 | 2/2017 | Briggs et al. | |
| 2008/0247219 A1 | 10/2008 | Choi et al. | |
| 2014/0042567 A1* | 2/2014 | Jung | H01L 43/08 257/421 |
| 2015/0262864 A1* | 9/2015 | Okamoto | H01L 21/31144 438/671 |
| 2016/0313644 A1* | 10/2016 | Oori | G03F 7/0757 |

(Continued)

FOREIGN PATENT DOCUMENTS

| | | |
|---|---|---|
| CN | 100521278 C | 7/2009 |
| TW | 201528492 A | 7/2015 |

(Continued)

OTHER PUBLICATIONS

D Kumar et al; "High Performance Resistive Switching Characteristics of SiN Films with a Cu/Ta/SiN/Cu/SiN/TiN Multilayer Structure"; Materials Science and Engineering 281; published on Dec. 28, 2017; pp. 1-5.

*Primary Examiner* — Didarul A Mazumder
(74) *Attorney, Agent, or Firm* — Muncy, Geissler, Olds & Lowe, P.C.

(57) ABSTRACT

A method of forming a memory device includes forming a first electrode; forming a resistive switching layer over the first electrode; forming a dielectric layer over the resistive switching layer; forming a first opening in the dielectric layer, wherein the first opening passes through the dielectric layer and exposes the resistive switching layer; forming a first trench in the dielectric layer, wherein the first trench is directly above the first opening; and forming a second electrode having a step shape in the first opening and the first trench.

18 Claims, 5 Drawing Sheets

(56) References Cited

U.S. PATENT DOCUMENTS

2017/0141125 A1* 5/2017 Tada ................ H01L 27/11807
2020/0044148 A1* 2/2020 Trinh ................ G11C 13/0004

FOREIGN PATENT DOCUMENTS

TW 201537798 A 10/2015
TW I568042 B 1/2017

* cited by examiner

MEMORY DEVICES INCLUDING STEP SHAPE ELECTRODE AND METHODS FOR FORMING THE SAME

CROSS REFERENCE TO RELATED APPLICATIONS

This application claims priority of Taiwan Patent Application No. 108121652, filed on Jun. 21, 2019, the entirety of which is incorporated by reference herein.

BACKGROUND

Technical Field

The present disclosure relates to memory devices and methods for forming the same, and in particular it is applicable to non-volatile memory devices, for example, conductive-bridging random access memory (CBRAM) devices.

Description of the Related Art

As semiconductor devices are gradually miniaturized, the difficulty of manufacturing these semiconductor devices increases dramatically, and undesirable defects may occur during the manufacturing process, which may cause degradation or damage to the device. Therefore, semiconductor devices must be continuously improved to increase the yield and improve the process window.

BRIEF SUMMARY

In accordance with some embodiments of the present disclosure, a method of forming a memory device is provided. The method includes forming a first electrode; forming a resistive switching layer over the first electrode; forming a dielectric layer over the resistive switching layer; forming a first opening in the dielectric layer, wherein the first opening passes through the dielectric layer and exposes the resistive switching layer; forming a first trench in the dielectric layer, wherein the first trench is directly above the first opening; and forming a second electrode having a step shape in the first opening and the first trench.

In accordance with some embodiments of the present disclosure, a memory device is provided. The memory device includes a first electrode; a resistive switching layer disposed over the first electrode; and a second electrode disposed over the resistive switching layer and having a step shape, wherein the bottom surface of the second electrode is smaller than the top surface of the resistive switching layer.

The above described features and advantages of the present disclosure can be more fully understood from the following embodiments with reference to the accompanying figures.

DETAILED DESCRIPTION

Figure 1A:
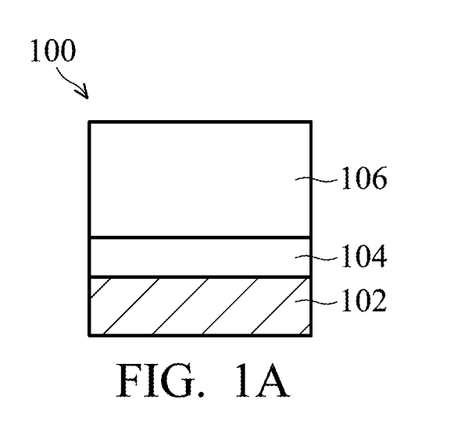
FIGS. 1A-1F are cross-sectional views illustrating various stages of manufacturing a memory device in accordance with some embodiments.

FIGS. 1A-1F are cross-sectional views illustrating various stages of manufacturing a memory device 100 in accordance with some embodiments. In an embodiment, the memory device 100 is a CBRAM device. In some embodiments, as illustrated in FIG. 1A, the memory device 100 includes a first electrode 102. In some embodiments, the first electrode 102 may include copper, silver, the like, or a combination thereof, and the first electrode 102 may include a single layer or a multilayer structure.

First, as illustrated in FIG. 1A, a resistance switching layer 104 and a dielectric layer 106 are sequentially formed on the first electrode 102. In some embodiments, the resistive switching layer 104 and the dielectric layer 106 are formed by, for example, a physical vapor deposition (PVD) process, a chemical vapor deposition (CVD) process, an atomic layer deposition (ALD) process, an evaporation process, the like, or a combination thereof. In some embodiments, the resistive switching layer 104 has a thickness in the range of from about 1 nanometer (nm) to about 100 nm, such as from about 5 nm to about 15 nm.

In some embodiments, the resistive switching layer 104 includes a nitride, a carbonitride, the like, or a combination thereof. For example, the resistive switching layer 104 may include silicon nitride, silicon carbonitride, the like, or a combination thereof. In some embodiments, the dielectric layer 106 includes an oxide, a low-k dielectric material, the like, or a combination thereof. For example, the dielectric layer 106 may include silicon oxide, silicon oxynitride, phosphosilicate glass (PSG), borosilicate glass (BSG), borophosphosilicate glass (BPSG), undoped silicate glass (USG), fluorinated silicate glass (FSG), the like, or a combination thereof.

Figure 1B:
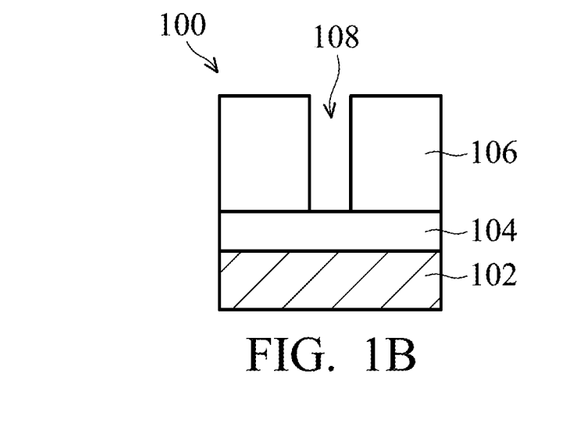

Then, as illustrated in FIG. 1B, a mask layer (not illustrated) is disposed on the dielectric layer 106, and then an etching process is performed with the mask layer as an etch mask to form an opening 108 in the dielectric layer 106. According to some embodiments, as illustrated in FIG. 1B, the opening 108 passes through the dielectric layer 106 and exposes the resistive switching layer 104. For example, the mask layer may include a photoresist, such as a positive photoresist or a negative photoresist. In some embodiments, the mask layer may include a hard mask and may be formed from silicon oxide, silicon nitride, silicon oxynitride, silicon carbide, silicon carbonitride, the like, or a combination thereof. The mask layer may be a single layer or a multilayer structure. The mask layer may be formed by a deposition process, a photolithography process, other applicable processes, or a combination thereof. In some embodiments, the deposition process includes spin coating, CVD, ALD, the like, or a combination thereof. For example, the photolithography process may include photoresist coating, soft bake, reticle alignment, exposure, post-exposure baking, development, cleaning, drying (such as hard baking), other applicable processes, or a combination thereof.

In some embodiments, the etching process may include a dry etching process, a wet etching process, or a combination thereof. For example, the dry etch process may include reactive ion etching (RIE), inductively coupled plasma (ICP) etching, neutron beam etching (NBE), electron cyclotron resonance (ECR) etching, the like, or a combination thereof. For example, the wet etch process may use, for example, hydrofluoric acid, ammonium hydroxide, or any applicable etchant.

Figure 1C:
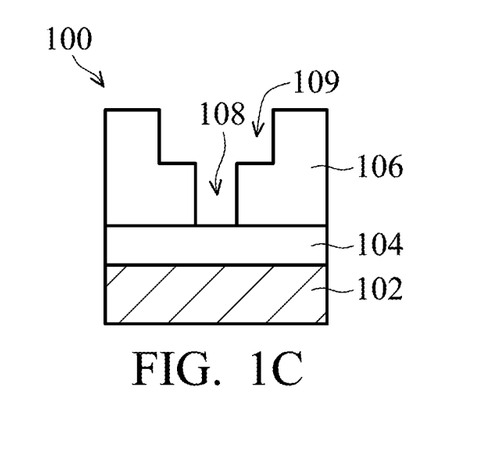

Then, as illustrated in FIG. 1C, a portion of the dielectric layer 106 is removed to form a trench 109, wherein the trench 109 is directly above the opening 108. The formation of the trench 109 is similar to the formation of the opening 108, and will not be repeated. In accordance with some embodiments, as illustrated in FIG. 1C, the width of the trench 109 is greater than the width of the opening 108. In other words, the opening 108 and the trench 109 together form a step-shaped opening.

It is worth noting that the opening 108 is formed first, and then the trench 109 is formed in the upper portion thereof to form a step-shaped opening in this embodiment. However, the present disclosure is not limited thereto. In another embodiment, the trench 109 may be formed first and then the opening 108 may be formed therein to form a step-shaped opening as shown in FIGS. 1E and 1F.

Figure 1D:
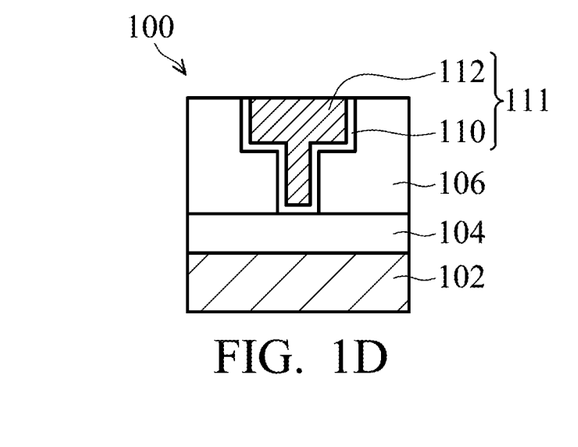
Figure 1E:
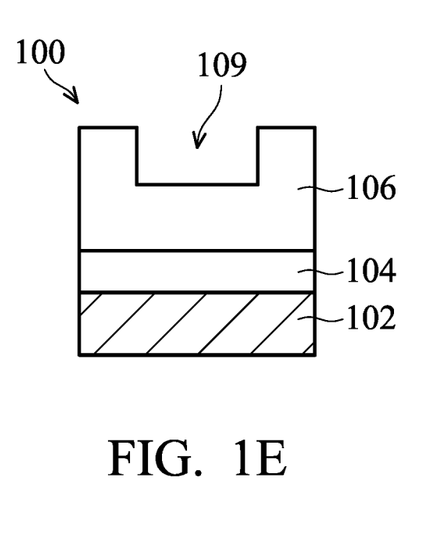
Figure 1F:
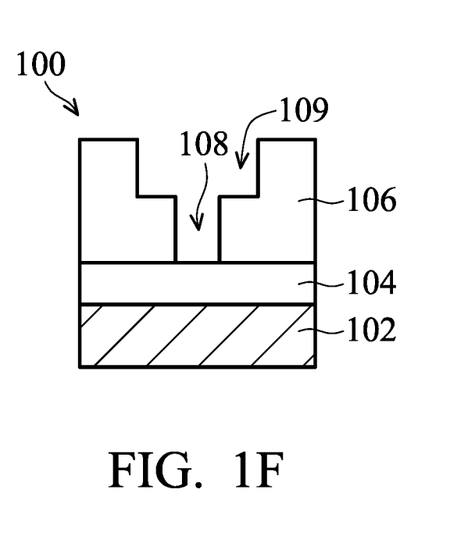

Then, as illustrated in FIG. 1D, a barrier layer 110 is conformally formed in the opening 108 and the trench 109. In some embodiments, the barrier layer 110 is formed by a PVD process, a CVD process, an ALD process, an evaporation process, the like, or a combination thereof. In some embodiments, the barrier layer 110 includes tantalum, tantalum nitride, the like, or a combination thereof.

Then, a bulk layer 112 is formed in remaining portions of the opening 108 and the trench 109. The bulk layer 112 may include copper, silver, the like, or a combination thereof. In some embodiments, the bulk layer 112 may be formed by a PVD process, a CVD process, an ALD process, an evaporation process, an electroplating process, the like, or a combination thereof.

Thereafter, a planarization process is performed to form the second electrode 111. In some embodiments, the planarization process includes an etch back process, a chemical mechanical polishing (CMP) process, the like, or a combination thereof. As illustrated in FIG. 1D, the second electrode 111 includes the barrier layer 110 and the bulk layer 112, and the barrier layer 110 is located between the bulk layer 112 and the resistive switching layer 104 and extends to a sidewall of the bulk layer 112. As illustrated, the second electrode 111 has a step-shaped sidewall. A portion of the second electrode 111 formed in the opening 108 can be used as a plug, and a portion of the second electrode 111 formed in the trench 109 can be used as a bit line connecting different memory cells.

In comparison with a resistive memory device formed by a deposition and etching process tend to being damaged by the etching process and damages the electrode and the resistance switching layer, the method according to the present disclosure can prevent the first electrode 102, the resistance switching layer 104, and the second electrode 111 from being damaged by forming the second electrode 111 by the damascene process. In addition, since the method according to the present disclosure utilizes the damascene process to form the second electrode 111, it can be easily integrated with the process of a peripheral region.

Furthermore, the resistive memory according to the present disclosure uses a metal such as copper or silver as an electrode, and a material such as nitride or carbonitride is formed as a resistance switching layer. Thereby, when the conductive filament 122 is formed in the resistance switching layer 104 corresponding to the electrode, portions of the resistance change layer 104 where the conductive filament 122 is not formed therein has the property of the barrier layer at the same time, and metal ions such as copper and silver of the conductive filament 122 lost due to diffusion can be prevented, thereby preventing the conductive filament 122 from being cut and improving the reliability of the memory device 100.

Figure 2A:
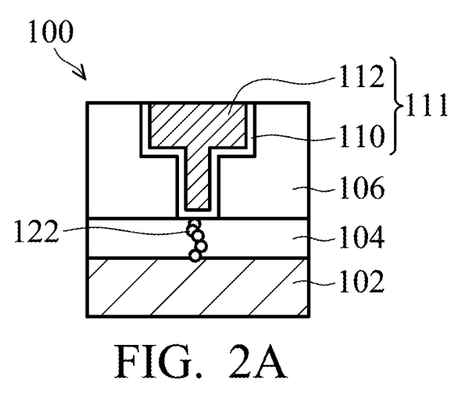
FIGS. 2A and 2B are cross-sectional views of a memory device in accordance with some embodiments.
Figure 2B:
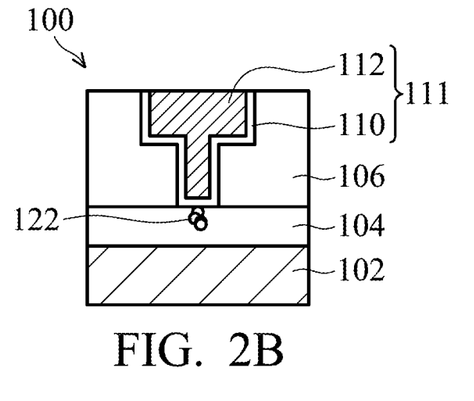

As illustrated in FIG. 2A, when a forward voltage is applied to the memory device 100, the metal material of the first electrode 102 is oxidized, the metal ions diffuse to the resistance switching layer 104 and are reduced in the electrode over the resistance switching layer 104, and the conductive filament 122 composed of metal ions is formed in the resistance switching layer 104, at which time the resistance switching layer 104 is converted into a low resistance state. Conversely, when a reverse voltage is applied to the memory device 100, the metal ions in the conductive filament 122 returns to the first electrode 102, causing the conductive filament 122 to be cut, and the resistance switching layer 104 is converted into a high resistance state (as illustrated in FIG. 2B). The memory device 100 converts the resistance by this way to write or read data to achieve a memory function.

Figure 3:
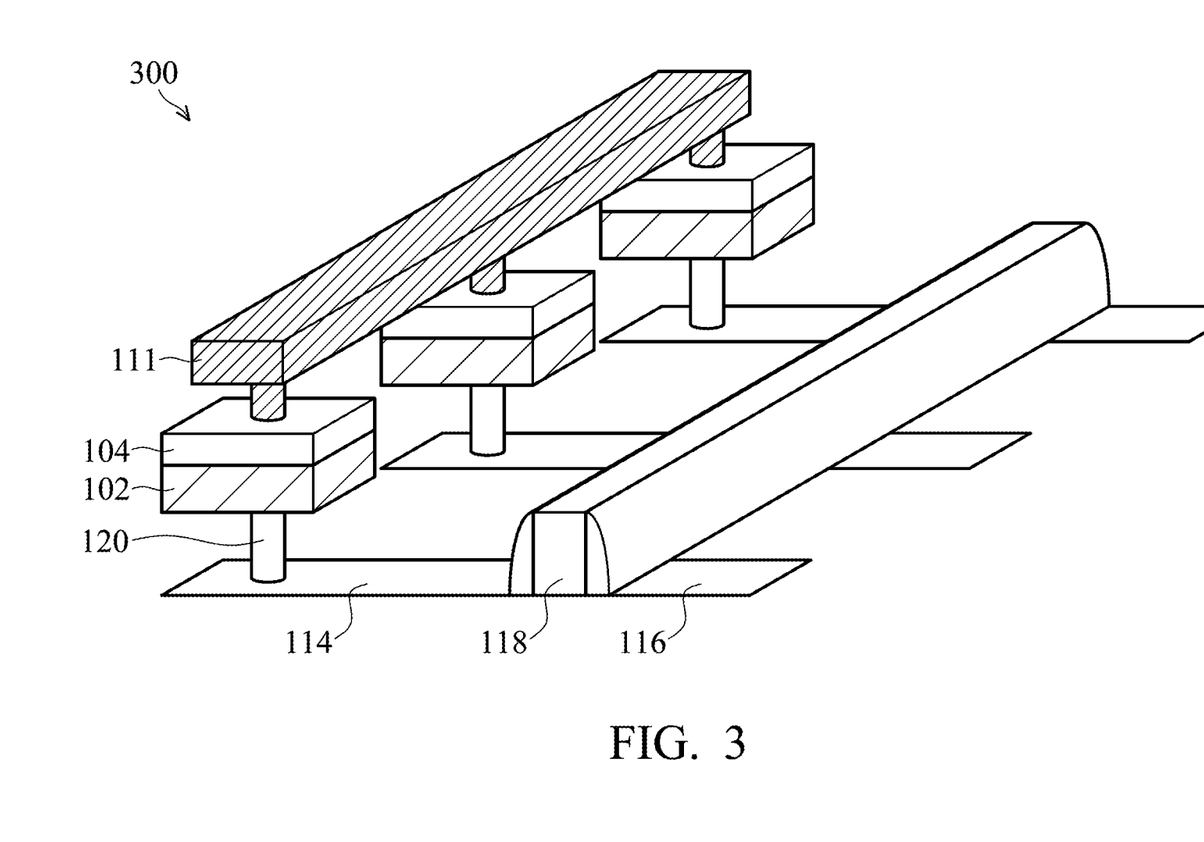
FIG. 3 is a perspective view of a memory device in accordance with some embodiments.

FIG. 3 is a perspective view of a memory device 300 of 1T1R (One-Transistor-One-Resistor) in accordance with some embodiments. In an embodiment, the memory device 300 is a CBRAM device. As illustrated in FIG. 3, the memory device 300 includes a first electrode 102, a resistance switching layer 104, a second electrode 111, a drain 114, a source 116, and a gate 118, and the first electrode 102 is electrically connected with the drain 114d via the contact 120. A portion of the second electrode 111 formed in the opening 108 can be used as a plug, and a portion of the second electrode 111 formed in the trench 109 can be used as a bit line connecting different memory cells. In some embodiments, the drain 114, the source 116, the gate 118, and the contact 120 may each independently include a conductive material, such as a doped polysilicon, a metal, the like, or a combination thereof. In this embodiment, the first electrode 102, the resistance switching layer 104, and the second electrode 111 form a resistor component, and the drain 114, the source 116, and the gate 118 form a transistor component for switching the resistance.

FIGS. 4A-4D are cross-sectional views illustrating various stages of manufacturing a memory device 400 in accordance with some embodiments. FIGS. 4A-4D use the same reference numerals as in FIGS. 1A-1D to describe the same elements as in FIGS. 1A-1D. The materials and formation of these elements are as described above and will not be repeated. The embodiments of FIGS. 4A-4D illustrate the formation of an integrated memory cell region and a peripheral region by a damascene process.

Figure 4A:
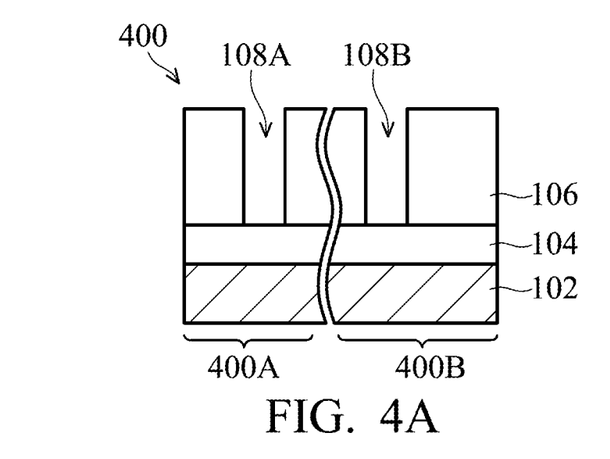
FIGS. 4A-4D are cross-sectional views illustrating various stages of manufacturing a memory device in accordance with some embodiments.

In an embodiment, the memory device 400 is a CBRAM device. In some embodiments, as illustrated in FIG. 4A, the memory device 400 includes a memory cell region 400A and a peripheral region 400B. As shown, the memory device 400 includes a first electrode 102, a resistive switching layer 104, and a dielectric layer 106. Examples of the materials and formation of the first electrode 102, the resistance switching layer 104, and the dielectric layer 106 are as described above, and will not be repeated.

Then, a mask layer (not illustrated) is disposed on the dielectric layer 106, and then an etching process is performed with the mask layer as an etch mask to form an opening 108A in the memory cell region 400A and an opening 108B in peripheral region 400B in the dielectric layer 106. Examples of the formation of the opening 108A and the opening 108B are as described above, and will not be repeated.

Figure 4B:
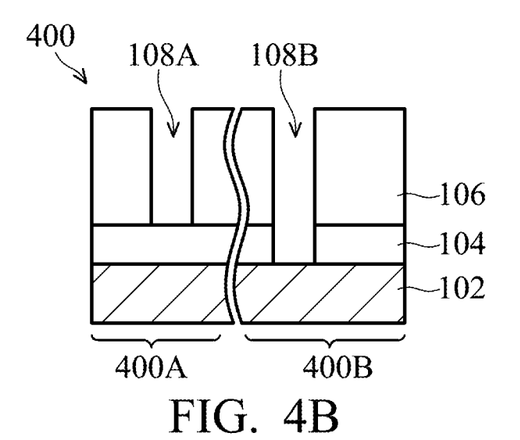

Then, as illustrated in FIG. 4B, a mask layer (not illustrated) is disposed on the dielectric layer 106, and then the etching process is performed with the mask layer as an etch mask to etch a portion of the resistive switching layer 104 exposed by the opening 108B, so that the opening 108B passes through the resistive switching layer 104 and exposes the first electrode 102.

Figure 4C:
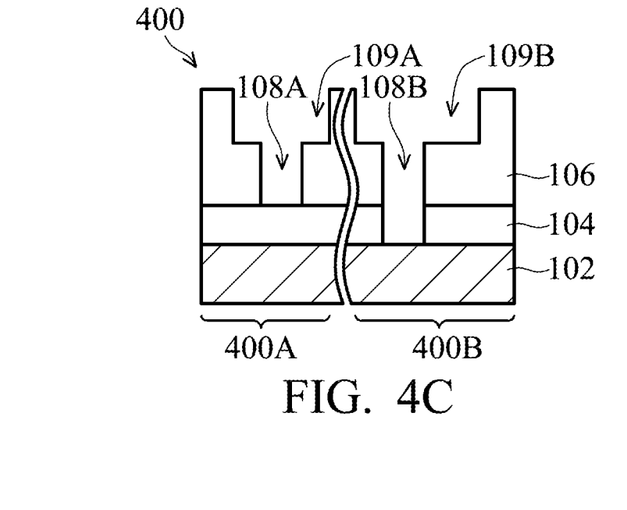

Then, as illustrated in FIG. 4C, a portion of the dielectric layer 106 is removed to form trenches 109A and 109B, wherein the trench 109A is located directly above the opening 108A, and the trench 109B is located directly above the opening 108B. The formation of the trenches 109A and 109B are similar to the formation of the openings 108A and 108B, and will not be repeated. In this embodiment, the openings 108A and 108B are formed first, and then the trenches 109A and 109B are formed in the upper portion thereof to form a step-shaped opening. However, the present disclosure is not limited thereto, and in another embodiment, the trenches 109A and 109B may be formed first and then the openings 108A and 108B may be formed therein to form a step-shaped opening.

Figure 4D:
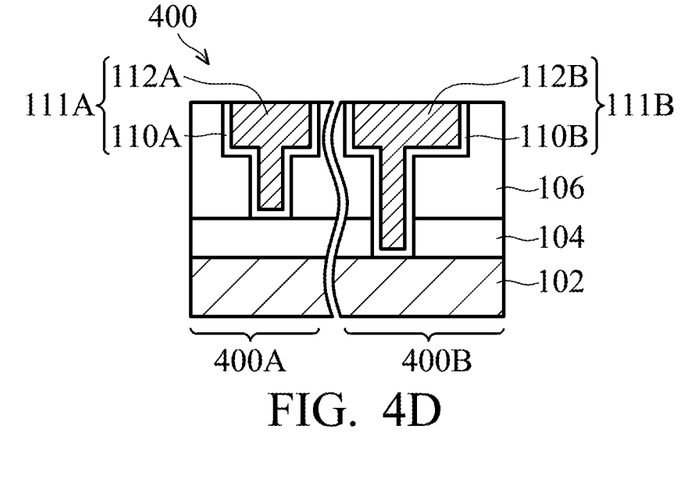

Next, as illustrated in FIG. 4D, barrier layers 110A and 110B are conformally formed in the openings 108A, 108B and the trenches 109A, 109B. Then, bulk layers 112A and 112B are formed in remaining portions of the openings 108A, 108B and the trenches 109A, 109B, respectively. Examples of the materials and formation of the barrier layers 110A, 110B and the bulk layers 112A, 112B are as described above and will not be repeated.

Thereafter, a planarization process is performed to form the second electrodes 111A and 111B. In some embodiments, the planarization process includes an etch back process, a CMP process, the like, or a combination thereof. As illustrated in FIG. 4D, the second electrode 111A includes the barrier layer 110A and the bulk layer 112A, and the barrier layer 110A is located between the bulk layer 112A and the resistance switching layer 104A and extends to a sidewall of the bulk layer 112A. As illustrated in FIG. 4D, the second electrode 111B includes the barrier layer 110B and the bulk layer 112B, and the barrier layer 110B is located between the bulk layer 112B and the resistance switching layer 104B and extends to a sidewall of the bulk layer 112B. Portions of the second electrodes 111A and 111B formed in the openings 108A and 108B can be used as plugs, and portions of the second electrodes 111A and 111B formed in the trenches 109A and 109B can be used as a bit line connecting different memory cells. Since the second electrodes 111A and 111B are simultaneously formed, the second electrodes 111A and 111B contain the same material.

In the above embodiment, the method according to the present disclosure utilizes the damascene process to form the second electrode 111B of the memory cell region 400A and the second electrode 111B of the peripheral region 400B, and the process of the memory cell region 400A can be easily integrated with the process of the peripheral region 400B, thereby reducing the process steps and increase the yield of the memory device 400.

In summary, the resistive memory device according to the present disclosure includes nitride, carbonitride, or the like as a resistive switching layer, so that the conductive filament formed by the metal ions are less likely to diffuse and avoid the conductive filaments formed therein being cut by diffusion, thereby improving the reliability of the memory device. In addition, the method according to the present disclosure forms an electrode by the damascene process, which can avoid the damage caused by the conventional method of forming the electrode by the etching process, can improve the reliability of the memory device, and can be easily integrated with the process of forming the peripheral region.

Although the present disclosure has been described above by various embodiments, these embodiments are not intended to limit the disclosure. Those skilled in the art should appreciate that they may readily use the present disclosure as a basis for making various changes, substitutions, and alterations for carrying out the same purposes and/or achieving the same advantages of the embodiments introduced herein. Those of ordinary skill in the art should also realize that such modifying or designing do not depart from the spirit and scope of the present disclosure. Therefore, the scope of protection of the present disclosure is defined as the subject matter set forth in the appended claims.

What is claimed is:

1. A method of forming memory devices, comprising:
    forming a first electrode;
    forming a resistive switching layer over the first electrode, wherein the resistive switching layer is converted into a low resistance state when a forward voltage is applied, and the resistive switching layer is converted into a high resistance state when a reverse voltage is applied;
    forming a dielectric layer over the resistive switching layer;
    forming a first opening in the dielectric layer, wherein the first opening passes through the dielectric layer and exposes the resistive switching layer;
    forming a first trench in the dielectric layer, wherein the first trench is directly above the first opening;
    forming a second opening in the dielectric layer, wherein the second opening passes through the resistive switching layer and exposes the first electrode;
    forming a second trench in the dielectric layer, wherein the second trench is directly above the second opening; and
    forming a second electrode in the first opening, the first trench, the second opening, and the second trench, wherein the second electrode has a step shape in the first opening and the first trench.

2. The method as claimed in claim 1, wherein forming the second electrode comprises:
    conformally forming a barrier layer in the first opening and the first trench; and
    forming a bulk layer in remaining portions of the first opening and the first trench, wherein the bulk layer comprises copper, silver, or a combination thereof.

3. The method as claimed in claim 2, wherein the barrier layer comprises tantalum, tantalum nitride, or a combination thereof.

4. The method as claimed in claim 1, wherein a width of the first trench is wider than a width of the first opening.

5. The method as claimed in claim 1, wherein the first trench is formed after the first opening.

6. The method as claimed in claim 1, wherein the first opening is formed after the first trench.

7. The method as claimed in claim 1, wherein a bottom surface of the second electrode is smaller than a top surface of the resistive switching layer.

8. The method as claimed in claim 1, wherein the resistive switching layer comprises nitride, carbonitride, or a combination thereof.

9. The method as claimed in claim 1, wherein the resistive switching layer comprises silicon nitride, silicon carbonitride, or a combination thereof.

10. The method as claimed in claim 1, wherein the first electrode comprises copper, silver, or a combination thereof.

11. The method as claimed in claim 1, wherein forming the second opening comprises:
   forming the second opening passing through the dielectric layer and exposing the resistive switching layer when forming the first opening; and
   etching a portion of the resistive switching layer exposed by the second opening so that the second opening passes through the resistive switching layer and exposes the first electrode.

12. A memory device, comprising:
   a first electrode;
   a resistive switching layer disposed over the first electrode, wherein the resistive switching layer is converted into a low resistance state when a forward voltage is applied, and the resistive switching layer is converted into a high resistance state when a reverse voltage is applied;
   a second electrode disposed over the resistive switching layer and having a step shape, wherein a bottom surface of the second electrode is smaller than a top surface of the resistive switching layer; and
   a third electrode disposed over the first electrode and passing through the resistive switching layer, wherein a material of the third electrode is the same as a material of the second electrode.

13. The memory device as claimed in claim 12, wherein the second electrode comprises:
   a bulk layer comprising copper, silver, or a combination thereof; and
   a barrier layer disposed between the bulk layer and the resistive switching layer and extending to a sidewall of the bulk layer.

14. The memory device as claimed in claim 13, wherein the barrier layer comprises tantalum, tantalum nitride, or a combination thereof.

15. The memory device as claimed in claim 12, wherein a width of a portion of the second electrode away from the resistive switching layer is greater than a width of a portion of the second electrode adjacent to the resistive switching layer.

16. The memory device as claimed in claim 12, wherein the resistive switching layer comprises nitride, carbonitride, or a combination thereof.

17. The memory device as claimed in claim 12, wherein the resistive switching layer comprises silicon nitride, silicon carbonitride, or a combination thereof.

18. The memory device as claimed in claim 12, wherein the first electrode comprises copper, silver, or a combination thereof.

* * * * *